US006972585B2

(12) United States Patent  (10) Patent No.: US 6,972,585 B2
Ito et al.  (45) Date of Patent: Dec. 6, 2005

(54) SEMICONDUCTOR INTEGRATED CIRCUIT DEVICE AND DIGITAL MEASURING INSTRUMENT

(75) Inventors: Yutaka Ito, Tokyo (JP); Tomokazu Sakurai, Tokyo (JP)

(73) Assignees: Elpida Memory, Inc., Tokyo (JP); Hitachi ULSI Systems Co., Ltd., Tokyo (JP); Hitachi, Ltd., Tokyo (JP)

( * ) Notice: Subject to any disclaimer, the term of this patent is extended or adjusted under 35 U.S.C. 154(b) by 0 days.

(21) Appl. No.: 10/999,970

(22) Filed: Dec. 1, 2004

(65) Prior Publication Data

US 2005/0141314 A1   Jun. 30, 2005

(30) Foreign Application Priority Data

Dec. 1, 2003   (JP) .............................. 2003-402102

(51) Int. Cl.[7] ........................................... G01R 31/26
(52) U.S. Cl. ................................... 324/765; 324/158.1
(58) Field of Search ........................... 324/158.1, 765, 324/763, 537, 532; 365/200, 201; 714/724, 714/733, 734

(56) References Cited

U.S. PATENT DOCUMENTS 6,247,138 B1 * 6/2001 Tamura et al. .............. 713/600

6,665,225 B2 * 12/2003 Tsujino ...................... 365/222

FOREIGN PATENT DOCUMENTS

| JP | S60-111971 A | 6/1985 |
| JP | H08-184460 A | 7/1996 |
| JP | 2002-056671 A | 2/2002 |

* cited by examiner

Primary Examiner—Vinh Nguyen
Assistant Examiner—Trung Q. Nguyen
(74) Attorney, Agent, or Firm—Sughrue Mion, PLLC

(57) ABSTRACT

In a semiconductor integrated circuit device having a DRAM 30, the DRAM 30 has an internal refresh period measuring circuit 20. Supplied with a test mode command as an external command, a command decode portion 32 delivers a test mode signal TM1 to the internal refresh period measuring circuit 20, supplies external clocks CLK as reference clocks ICLK to the internal refresh period measuring circuit 20, and thereafter activates a self-refresh control circuit 33. When activated, the self-refresh control circuit 33 delivers an internal oscillation signal LOSC or OSC having a self-refresh period to the internal refresh period measuring circuit 20. The internal refresh period measuring circuit 20 counts the number of the reference clocks supplied during a self-refresh period of the internal oscillation signal.

10 Claims, 13 Drawing Sheets

SEMICONDUCTOR INTEGRATED CIRCUIT DEVICE AND DIGITAL MEASURING INSTRUMENT

This invention claims priority to prior Japanese patent application JP 2003-402102, the disclosure of which is incorporated herein by reference.

BACKGROUND OF THE INVENTION

This invention relates to measurement of a period of an internal signal of a semiconductor integrated circuit device including a memory device.

In a memory device using a DRAM (Dynamic Random Access Memory) cell, for example, a clock synchronization DRAM known as a SDRAM (Synchronous Dynamic Random Access Memory), a self-refresh operation is generally carried out. In the self-refresh operation, charge information is read from the DRAM cell and rewritten into the DRAM cell before charges of the DRAM cell fade away and are lost. Sometimes, a super self-refresh operation having a longer cycle or period than that of a normal self-refresh operation is carried out. For example, Japanese Patent Application Publication (JP-A) No. 2002-56671 discloses a semiconductor integrated circuit device including a SDRAM operable in a super self-refresh mode.

At first referring to FIGS. 1 through 5, first through third related techniques for measuring a period of an internal oscillation signal of the semiconductor integrated circuit device of the type will be described as a basis of this invention.

The first related technique is a method in which the internal oscillation signal OSC (or LOSC) is delivered to the outside of the semiconductor integrated circuit device and the period of the signal is measured by the use of an oscilloscope or a fail memory (FM).

In a semiconductor integrated circuit device illustrated in FIG. 1, a circuit 10a is supplied with test mode signals TM1 and TM2 and delivers an internal oscillation signal OSC (or LOSC) through an internal input/output bus (I/O) of the semiconductor integrated circuit device to a data input/output terminal DQ as a data output signal. As illustrated in FIG. 2, the circuit 10a is supplied with the test mode signal TM1 put into a high level by a test mode command MRS (Mode Register Set) supplied to the semiconductor integrated circuit device as an external command. In addition, the circuit 10a is supplied with the internal oscillation signal OSC or LOSC activated or started by a self-refresh entry command SELF (Self-Refresh Entry) subsequently supplied to the semiconductor integrated circuit device as an external command. In FIG. 1, upon testing the internal oscillation signal OSC, the circuit 10a is supplied with a test mode signal TM2 of a high level. Upon testing the internal oscillation signal LOSC, the circuit 10a is supplied with the test mode signal TM2 of a low level.

As illustrated in FIG. 2 also, the OSC signal is an oscillation signal activated or started in response to the self-refresh entry command SELF in the semiconductor integrated circuit device including the DRAM and is a signal to be measured. Similarly, the LOSC signal is an oscillation signal to be measured and is an oscillation signal when a self-refresh period is long (1 second (1s) or more). A difference between the OSC signal and the LOSC (long oscillator cycle) signal is only a period length.

In FIG. 2, CKE represents a clock enable signal supplied to the semiconductor integrated circuit device. CLK represents external input clocks supplied to the semiconductor integrated circuit device.

In a semiconductor integrated circuit device illustrated in FIG. 3, a circuit 10B similarly delivers an internal oscillation signal OSC (or LOSC) through an input/output bus (I/O) of the semiconductor integrated circuit device to a data input/output terminal DQ as a data output signal.

An output waveform of the data output signal at the data input/output terminal DQ of the semiconductor integrated circuit illustrated in FIG. 1 or 3 is monitored by an oscilloscope to obtain a period of the output waveform. Alternatively, the output waveform is shaped by an internal circuit of the semiconductor integrated circuit device into a rectangular wave and outputted. As shown in FIG. 2, GO or NO-GO (PASS or FAIL) is captured into a fail memory (FM) at a predetermined strobe (STRB) interval. A READ instruction is executed upon the fail memory (FM) to know a bit interval of PASS/FAIL. Thus, the period of the LOSC signal or the OSC signal can be measured.

Next, the second related technique will be described.

As described above, a super self-refresh (SSR) operation is a long-period self-refresh operation (having a refresh period of 1s or more). By carrying out the long-period self-refresh operation, a refresh current is suppressed.

The second related technique is a method of calculating an internal refresh period from a super self-refresh current (ICC6SSR) as an operating current during the long-period self-refresh (SSR) operation (method of indirectly measuring the period).

As shown in FIG. 4, the super self-refresh current (ICC6SSR) as a long-period operating current consumes a self-refresh current (ICC6=1000 $\mu$A) over a certain long period. Therefore, by measuring ICC6 and ICC6SSR, the certain long period can be approximated.

As shown in FIGS. 5A through 5C, the third related technique is a method of calculating an average of a plurality of measurements of the long-period operating current (for example, ICC6SSR).

A tester does not has a function of controlling a measuring time and a measuring point. At present, the refresh current can be measured only by three methods shown in FIGS. 6A through 5C.

First Method

Referring to FIG. 5A, current measurement is repeatedly carried out 1000 times under control of a program. A measurement time is one minute. However, since current measurement is carried out at random points, variation in average current is large and accurate measurement is difficult.

Second Method

Referring to FIG. 5B, current measurement is carried out in a wait time (see FIG. 4) at a controlled sampling interval. A measurement time is long because current measurement can not be carried out in a single pass but a test is carried out per every wait time. It takes 10 minutes to obtain an average of 40 times of measurements. Because the average is obtained, accurate measurement is difficult.

Third Method

Referring to FIG. 5C, measurement is carried out by the use of a command "MEAS!1000" (requesting consecutive measurements of 1000 times) present in the tester. Since a first point of sampling can not be controlled, measurement may possibly be carried out until a peak of a next refresh period. Variation in average current is large and accurate measurement is difficult.

In the measurement according to the third method, an error (variation in ICC6SSR measurement (population parameter=280 integrated circuit devices per one wafer) was as follows.

For data acquired by averaging consecutive measurements of 1000 times (FIG. 5C), the error was as large as ±20%.

Even when measurement was carried out per every wait time for 20 minutes (FIG. 5B), the error was ±10%.

Japanese Patent Application Publication (JP-A) No. S60-111971 discloses a period measuring circuit.

Japanese Patent Application Publication (JP-A) No. H8-184460 discloses a measuring instrument driving apparatus having a period measuring portion.

As is obvious from FIG. 5 also, the related techniques are disadvantageous in that accurate measurement is difficult by a memory tester alone and that measurement is difficult if the period is long. The memory tester does not assume measurement of a long-period current, such as ICC6SSR mentioned herein, varying in a period of one second. Therefore, current measurement can not be carried out in a single pass but is carried out while controlling the wait time of the tester. Therefore, the measurement time is as long as about 20 minutes. Since the average is obtained, accurate measurement is difficult (the error of ±10% occurs even if measurement is carried out for 20 minutes).

The above-mentioned problem has not been addressed so far because, in existing LSI products, it is not required to measure an average current having a long period on the order of second.

SUMMARY OF THE INVENTION

It is an object of this invention to provide a semiconductor integrated circuit device having a DRAM, which enables accurate measurement of a period by providing an internal refresh period measuring circuit.

It is another object of this invention to provide a digital measuring instrument capable of measuring a long period in a semiconductor integrated circuit device having a DRAM.

According to this invention, there is provided a semiconductor integrated circuit device having a DRAM, the DRAM comprising a memory array and a control portion supplied with external clocks from the outside of the DRAM, the control portion comprising a command decode portion responsive to an external command from the outside of the DRAM for decoding the external command, and a self-refresh control circuit for repeatedly carrying out a self-refresh operation upon the memory array in a self-refresh period when the self-refresh control circuit is activated, wherein the DRAM further comprises an internal refresh period measuring circuit for measuring the self-refresh period; the command decode portion delivering a test mode signal representative of a test mode to the internal refresh period measuring circuit, supplying the external clocks as reference clocks to the internal refresh period measuring circuit, and then activating the self-refresh control circuit when a test mode command for measuring the self-refresh period is received as the external command; the self-refresh control circuit carrying out the self-refresh operation upon the memory array and delivering an internal oscillation signal having the self-refresh period to the internal refresh period measuring circuit when the self-refresh control circuit is activated; the internal refresh period measuring circuit comprising a counter for counting the number of the reference clocks supplied during the self-refresh period of the internal oscillation signal supplied thereto, and an output circuit for delivering a count result of a count-up operation by the counter to the outside of the internal refresh period measuring circuit in response to the test mode signal.

According to this invention, there is also provided a digital measuring instrument for measuring an operating current when a semiconductor integrated circuit device having a DRAM carries out a self-refresh operation in a self-refresh period, the digital measuring instrument comprising an A/D converter for carrying out an A/D converting operation of converting measured analog data of the operating current into digital data to output the digital data as acquired data; an adder for carrying out an addition of adding the acquired data to adder output data to output the result of addition as the adder output data; a timer given a wait time; and a controller; the controller being response to a measuring operation start signal and starting a first measuring operation, making the A/D converter carry out the A/D converting operation to output the acquired data, then making the adder carry out the addition to output the result of addition as the adder output data, then starting the timer to monitor the wait time as a measurement temporary suspension state, finishing the first measuring operation when the timer completes monitoring of the wait time, starting a second measuring operation, and carrying out the second measuring operation in the manner similar to the first measuring operation.

According to this invention, there is also provided a digital measuring instrument for measuring an operating current when a semiconductor integrated circuit device having a DRAM carries out a self-refresh operation in a self-refresh period, the digital measuring instrument comprising an A/D converter for carrying out an A/D converting operation of converting measured analog data of the operating current into digital data to output the digital data as acquired data; an adder for carrying out an addition of adding the acquired data to adder output data to output the result of addition as the adder output data; a divider supplied with the number N of times of measurements (N being an integer not smaller than 3) for carrying out a division of dividing the adder output data by the number N to obtain an average; a timer given a wait time; and a controller supplied with the number N; the controller being response to a measuring operation start signal and starting a first measuring operation, making the A/D converter carry out the A/D converting operation to output the acquired data, then making the adder carry out the addition to output the result of addition as the adder output data, then starting the timer to monitor the wait time as a measurement temporary suspension state, finishing the first measuring operation when the timer completes monitoring of the wait time, starting a second measuring operation, carrying out the second measuring operation in the manner similar to the first measuring operation, repeatedly carrying out third through N-th measuring operations in the manner similar to the first measuring operation, and making the divider carry out the division to produce the average when the N-th measuring operation is finished.

Neither of the Japanese Patent Application Publications (JP-A) Nos. S60-111971 and H8-184460 discloses that "the DRAM comprises an internal refresh period measuring circuit for measuring the self-refresh period", that "the command decode portion . . . supplying the external clocks as reference clocks to the internal refresh period measuring circuit, . . . when a test mode command for measuring the self-refresh period is received as the external command", and that "the internal refresh period measuring circuit comprising a counter for counting the number of the reference clocks supplied during the self-refresh period of the internal oscillation signal supplied thereto". Thus, neither of the Japanese Patent Application Publications (JP-A) Nos. S60-111971 and H8-184460 discloses measurement of the refresh period of the DRAM.

Further, neither of the Japanese Patent Application Publications (JP-A) Nos. S60-111971 and H8-184460 discloses "a digital measuring instrument for measuring an operating current when a semiconductor integrated circuit device having a DRAM carries out a self-refresh operation in a self-refresh period".

According to this invention, it is possible to obtain a semiconductor integrated circuit device having a DRAM, which enables accurate measurement of a period by providing an internal refresh period measuring circuit.

According to this invention, it is also possible to obtain a digital measuring instrument capable of measuring a long period in a semiconductor integrated circuit device having a DRAM.

DESCRIPTION OF THE PREFERRED EMBODIMENTS

Figure 1:
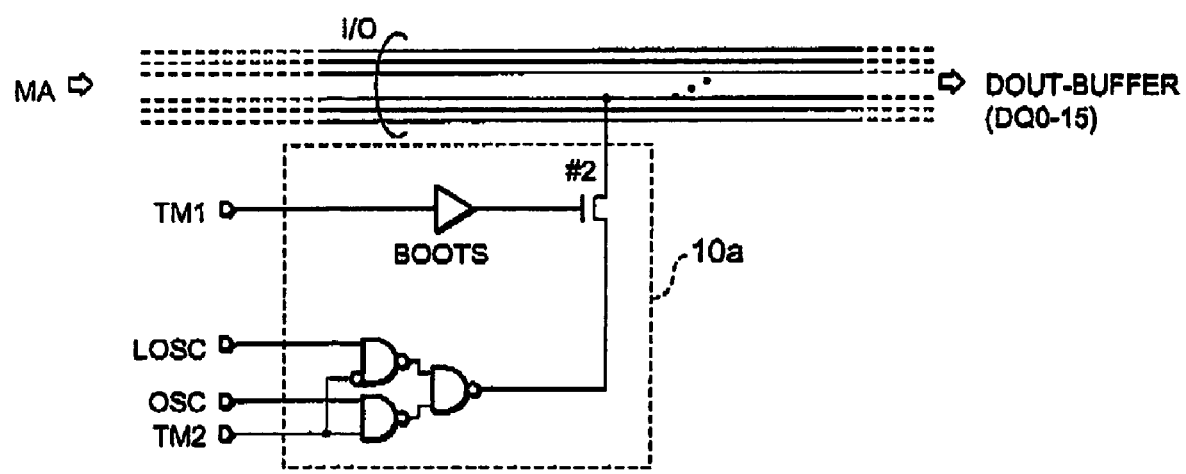
FIG. 1 shows a semiconductor integrated circuit device for use in describing a first related technique.
Figure 2:
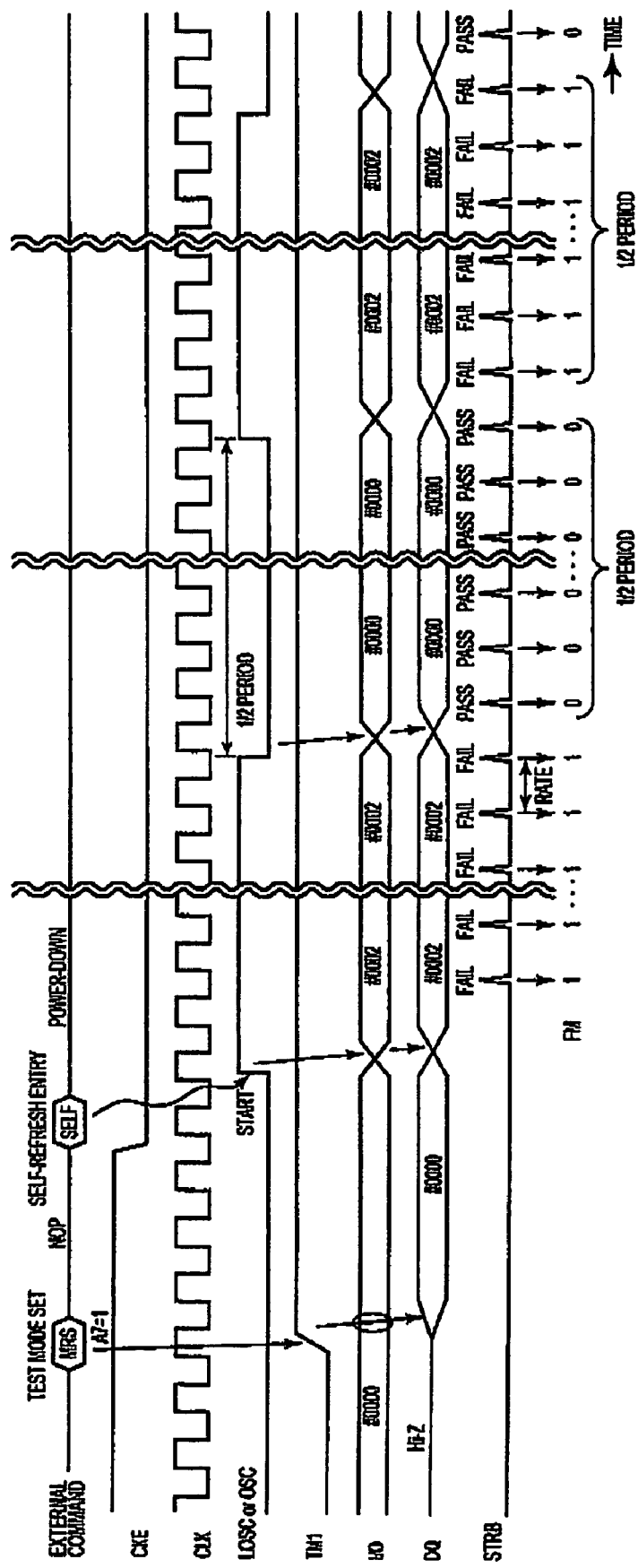
FIG. 2 shows an operation of the semiconductor integrated circuit device illustrated in FIG. 1.
Figure 3:
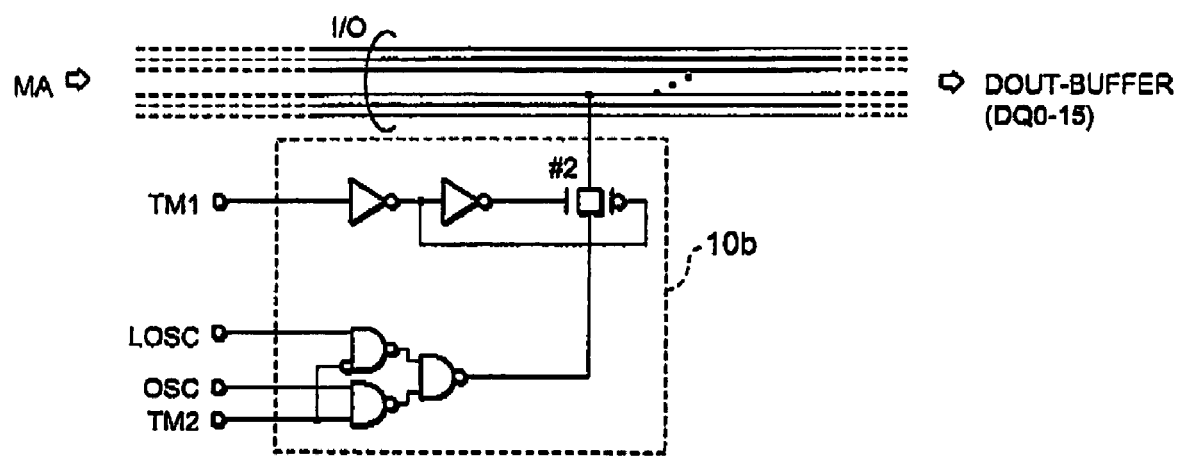
FIG. 3 shows another semiconductor integrated circuit device for use in describing the first related technique.
Figure 4:
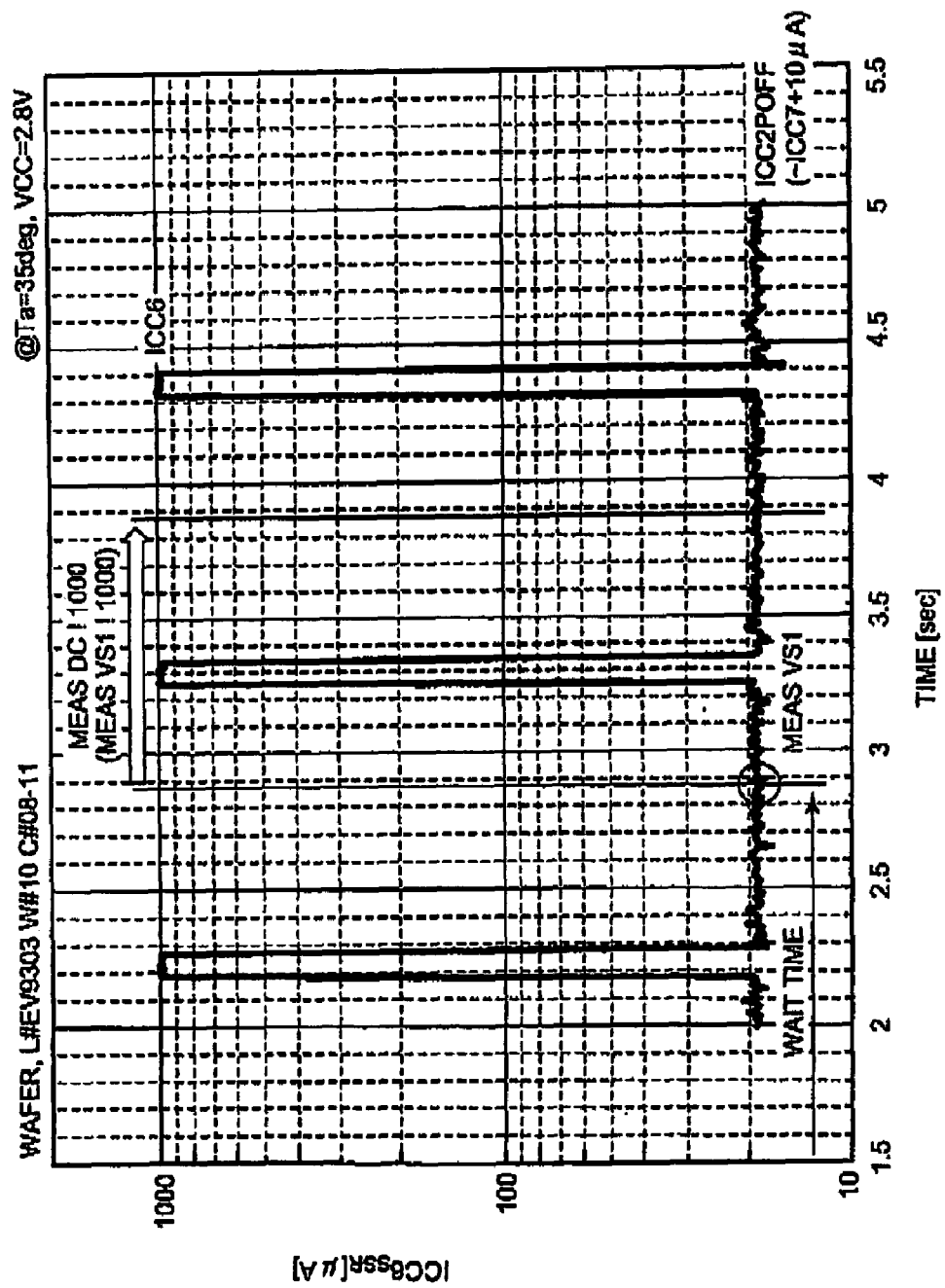
FIG. 4 is a view for describing a second related technique and shows a result of measurement (measured data) of a long-period operating current (ICC6SSR)

Now, preferred embodiments of this invention will be described with reference to the drawing.

In this invention, an internal period of a semiconductor integrated circuit having a DRAM is measured in the following manner. An internal counter circuit of the semiconductor integrated circuit device measures the internal period as a multiple of a period of reference clocks supplied from the outside to the semiconductor integrated circuit device. A result of measurement is produced in a test mode. In this manner, it is possible to measure the internal period, compensating the variation in operating temperature and voltage required for the device.

Figure 6:
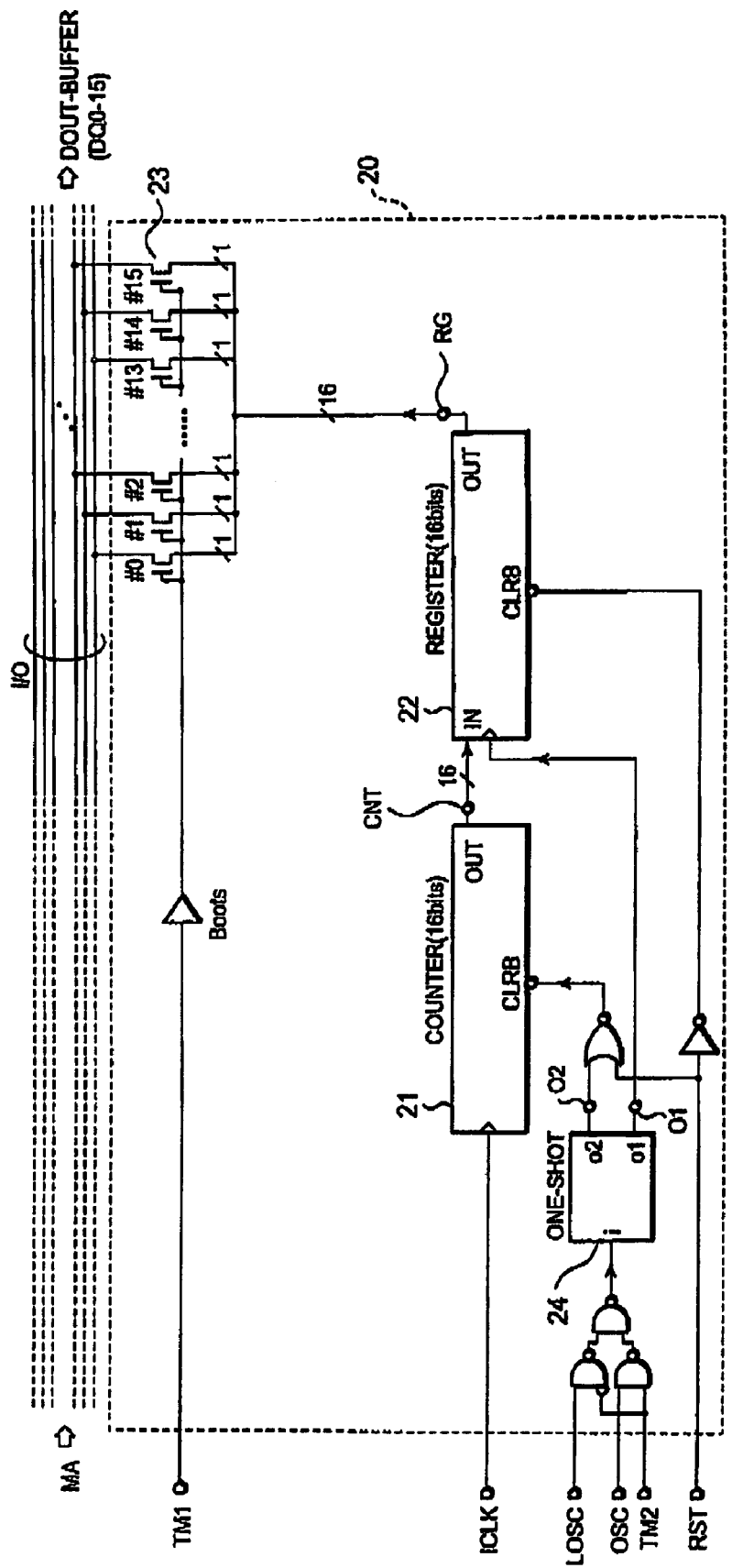
FIG. 6 is a block diagram of an internal refresh period measuring circuit according to a first embodiment of this invention.

Referring to FIG. 6, an internal refresh period measuring circuit 20 according to a first embodiment of this invention comprises a counter 21, a register 22, and a predetermined number of FETs (Field Effect Transistors) 23. The internal refresh period measuring circuit 20 is supplied with a test mode signal TM1 from the outside. Thereafter, an internal oscillation signal LOSC or OSC is supplied. In response to reference clocks ICLK from the outside, the counter 21 carries out a counting operation to obtain an integrated value CNT. Supplied with a next internal oscillation signal LOSC or OSC, the integrated value CNT is supplied to and stored in the register 22 as a registered value RG. The registered value RG is delivered through the FETs 23 to an internal input/output bus I/O at the outside of the internal refresh period measuring circuit 20. The FETs 23 serve as output circuits to be turned on during a period in which the test mode signal TM1 has a high level (i.e., during a test mode period). By the use of the integrated value CNT on the input/output bus I/O, it is possible to measure a period of the internal oscillation signal LOSC or OSC.

In FIG. 6, the internal refresh period measuring circuit 20 is supplied with a test mode signal TM2 of a low level upon testing the internal oscillation signal LOSC. Upon testing the internal oscillation signal OSC, the internal refresh period measuring circuit 20 is supplied with the test mode signal TM2 of a high level.

Specifically, the internal refresh period measuring circuit 20 further has a mono-stable or one-shot multivibrator (One-Shot) 24. The one-shot multivibrator 24 is supplied with the internal oscillation signal LOSC or OSC and, in response to a rising or leading edge of the internal oscillation signal LOSC or OSC, produces a pulse signal O1 for supplying the value in the counter 21 to the register 22. Further, in response to a falling or trailing edge of the pulse signal O1, the one-shot multivibrator 22 produces a pulse signal O2 for resetting the counter 21. The counter 21 counts and integrates the number of rising edges of the reference clocks ICLK after the counter 21 is reset by the pulse signal O2 and before the counter 21 is reset by a next pulse signal O2. In response to the pulse signal O1, the register 22 memorizes, as the registered value RG, the integrated value CNT in the counter 21.

Figure 7:
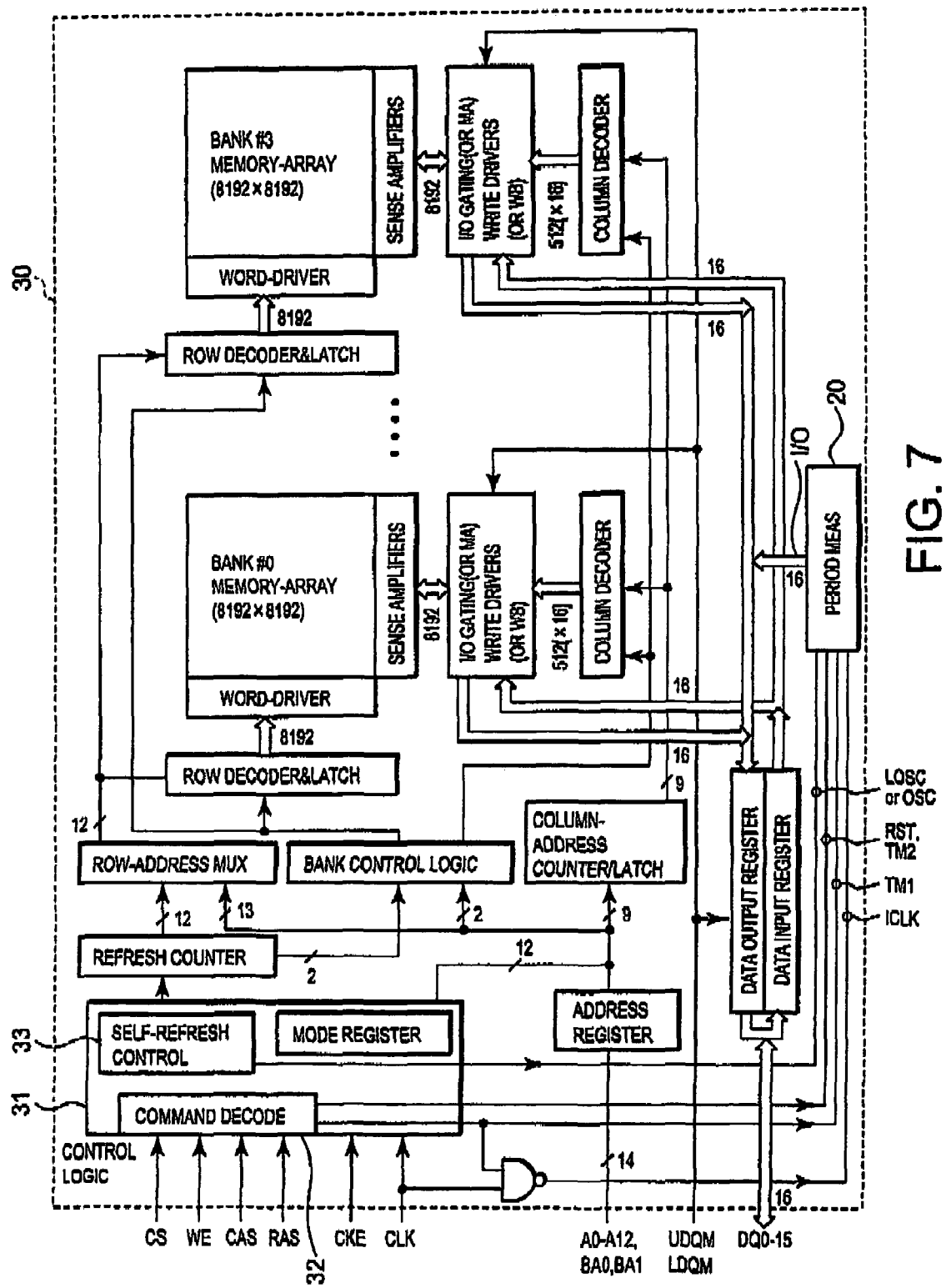
FIG. 7 is a block diagram of a semiconductor integrated circuit device having a SDRAM provided with the internal refresh period measuring circuit in FIG. 6.

Referring to FIG. 7, a semiconductor integrated circuit device has a SDRAM 30 provided with the internal refresh period measuring circuit 20 in FIG. 6.

In FIG. 7, the semiconductor integrated circuit device is a semiconductor dynamic memory for inputting and outputting data in synchronization with external input clocks CLK. The semiconductor integrated circuit device comprises first through fourth memory arrays (first through fourth banks #0 through #3). Among the first through the fourth banks #0 to #3, the second and the third banks #1 and #2 are not shown in the figure for convenience of illustration but are similar in structure to the first and the fourth banks #0 and #3. The semiconductor integrated circuit device has, as interfaces, clock terminals and control signal terminals including CLK (clock), CKE (clock enable), CS (chip select), WE (write enable), CAS (column address stobe), and RAS (row address stobe), address signal terminals including A0–A12 (memory array address) and BA0–BA1 (bank address), and data input/output signal terminals including UDQM and LDQM (data mask signals) and DQ0–DQ15 (data input/output signal).

The semiconductor integrated circuit device further comprises a control logic (CONTROL LOGIC) (i.e., a control portion) 31 for controlling the SDRAM 30.

The control logic 31 comprises an input buffer circuit (COMMAND DECODE) (i.e., a command decode portion) 32 responsive to an external command as a combination of a CS (chip select) signal, a WE (write enable) signal, a CAS (column address enable) signal, and a RAS (low address enable) signal for decoding the external command.

The input buffer circuit (COMMAND DECODE) 32 decodes the external command as a combination of the CKE, CS, WE, CAS, and RAS signals. If a test mode command MRS (Mode Register Set) for measurement of the internal period is obtained as a result of decoding, the control logic (CONTROL LOGIC) 31 activates a self-refresh control circuit (SELF_REFRESH CONTROL) 33. When activated, the self-refresh control circuit 33 executes a super self-refresh (long-period self-refresh) operation (or a normal self-refresh operation) upon the first through the fourth memory arrays (the first through the fourth banks #0 to #3). In this event, the self-refresh control circuit 33 supplies the LOSC (or OSC) signal to the internal refresh period measuring circuit 20. In response to the LOSC (or OSC) signal, the internal refresh period measuring circuit 20 is turned into a measurable state. Specifically, the internal refresh period measuring circuit 20 is put into a state in which the internal refresh period measuring circuit 20 is supplied with the test mode signal TM1 of a high level from the input buffer circuit 32 and the external input clocks CLK as the reference clocks ICLK for measurement of the period and a present value on the internal input/output bus (I/O) is delivered to a data output register (DATA OUTPUT REGISTER). After completion of measurement of the internal period, the internal refresh period measuring circuit 20 successively supplies period measured data (measured value) to the data output register. The measured value is delivered to an external output buffer circuit connected to the terminal DQ at the outside.

By multiplying the measured value delivered to the outside and a period of the external clocks CLK (tester), it is possible to obtain the result of measurement of the refresh period of the semiconductor integrated circuit device (chip).

Figure 8:
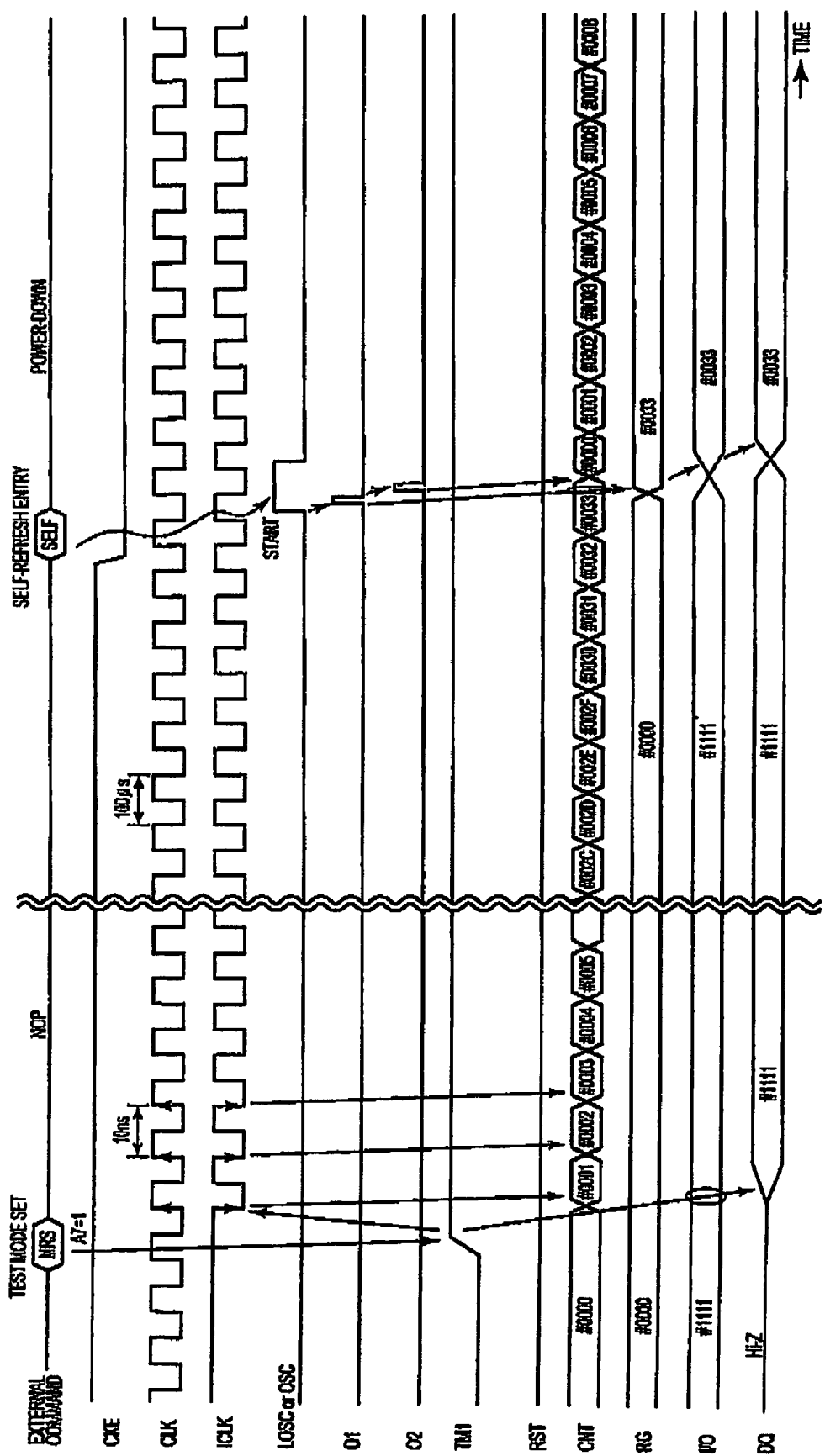
FIG. 8 is a view for describing a first part of operation of the internal refresh period measuring circuit in FIG. 6.

Next referring to FIGS. 8 and 9, description will be made of an operation of the internal refresh period measuring circuit 20 in FIGS. 6 and 7. By the use of the external command MRS, the semiconductor integrated circuit device enters into a test mode for measurement of the internal period. Then, the internal refresh period measuring circuit 20 is put into the state in which the internal refresh period measuring circuit 20 is supplied with the test mode signal TM1 of a high level and the external clocks CLK as the reference clocks ICLK for measurement of the period and the present value on the internal input/output bus (I/O) is delivered from DQ.

Simultaneously, the counter 21 is supplied with the reference clocks ICLK starting clocking and starts a count-up operation.

Next, by the use of an external command SELF, the semiconductor integrated circuit device enters into a super self-refresh mode (or a self-refresh mode). Then, the internal oscillation signal LOSC (or OSC) as an object to be measured starts operation. In response to a rising edge of the internal oscillation signal LOSC (or OSC), the value CNT of the counter 21 is supplied to and stored in the register 22 as the registered value RG by the pulse signal O1. Thereafter, the value CNT of the counter 21 is reset by the pulse signal O2. Subsequently, the counter 21 carries out the count-up operation. In response to a next rising edge of the internal oscillation signal LOSC (or OSC), the value CNT of the counter 21 is supplied to and stored in the register 22 as the registered value RG by the pulse signal O1. Thereafter, the value CNT of the counter 21 is reset by the pulse signal O2.

The value CNT supplied to the register 22 is delivered to the internal input/output bus (I/O). The value is successively delivered from the output buffer circuit connected to the terminal DQ to the outside.

By multiplying the measured value delivered to the outside and the period of the external clocks CLK supplied from the tester, result of measurement of a refresh period of the semiconductor integrated circuit device (chip) can be obtained.

Thus, it is possible to measure the internal refresh period from the measured value and the period of the reference clocks used in measurement.

Figure 9:
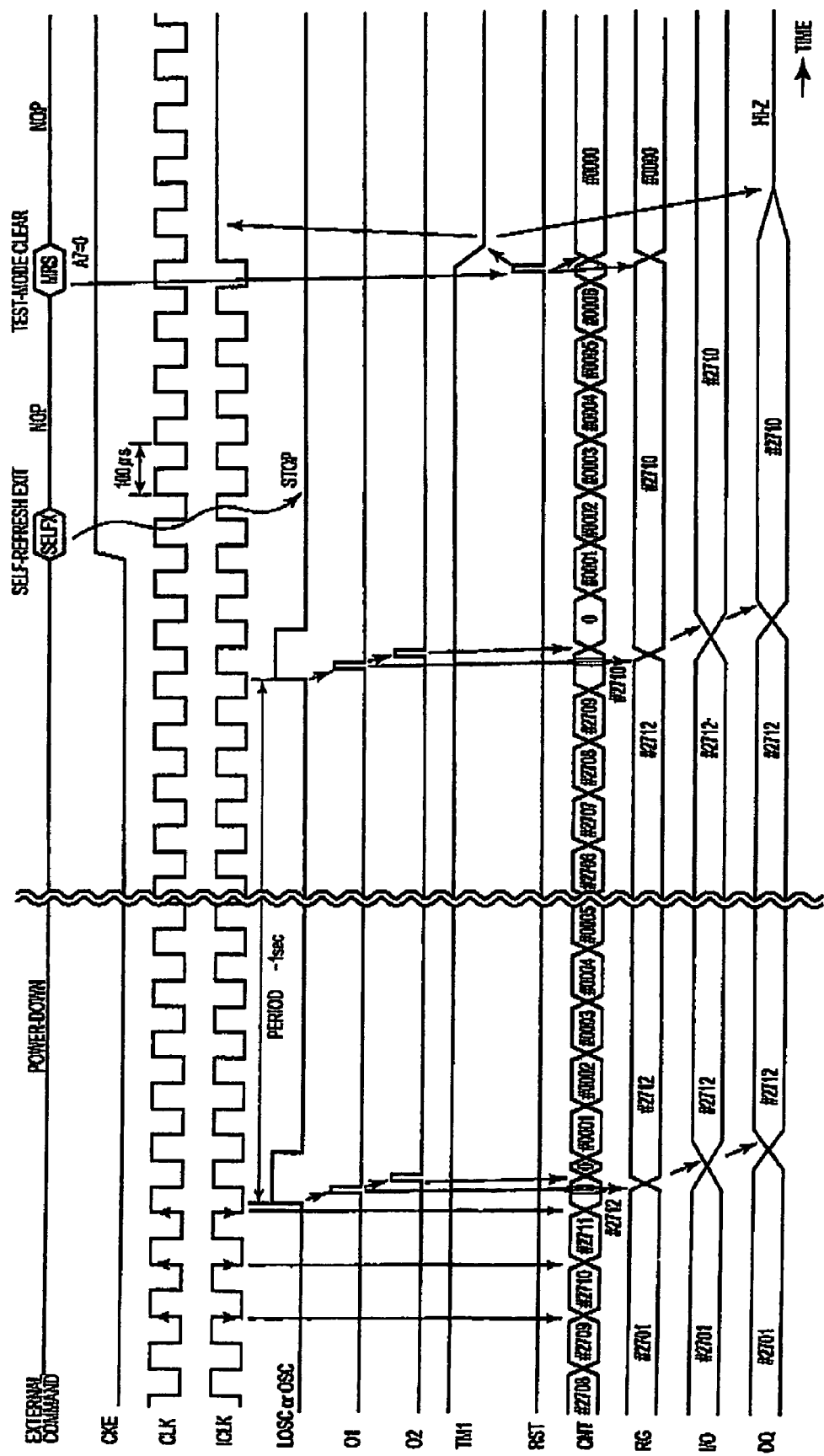
FIG. 9 is a view for describing a second part of operation of the internal refresh period measuring circuit in FIG. 6.

In FIG. 7, after completion of measurement of the internal refresh period, the semiconductor integrated circuit device exits from the super self-refresh mode (or the self-refresh mode) by the use of an external command SELFX as illustrated in FIG. 9. Specifically, when the external command SELFX is decoded, the input buffer circuit (COMMAND DECODE) 32 deactivates the self-refresh control circuit 33 and stops supply of the internal oscillation signal LOSC (or OSC) to the internal refresh period measuring circuit 20. Subsequently, as illustrated in FIG. 9, the test mode is cleared by the use of the external command MRS. Specifically, when the external command MRS is decoded into Test-mode Clear, the input buffer circuit (COMMAND DECODE) 32 delivers a reset pulse RST to the internal refresh period measuring circuit 20 to clear the counter 21 and the register 22 in the internal refresh period measuring circuit 20. In addition, the input buffer circuit (COMMAND DECODE) 32 turns the test mode signal TM1 to the internal refresh period measuring circuit 20 into a low level and stops supply of the reference clocks ICLK to the internal refresh period measuring circuit 20.

Figure 5A:
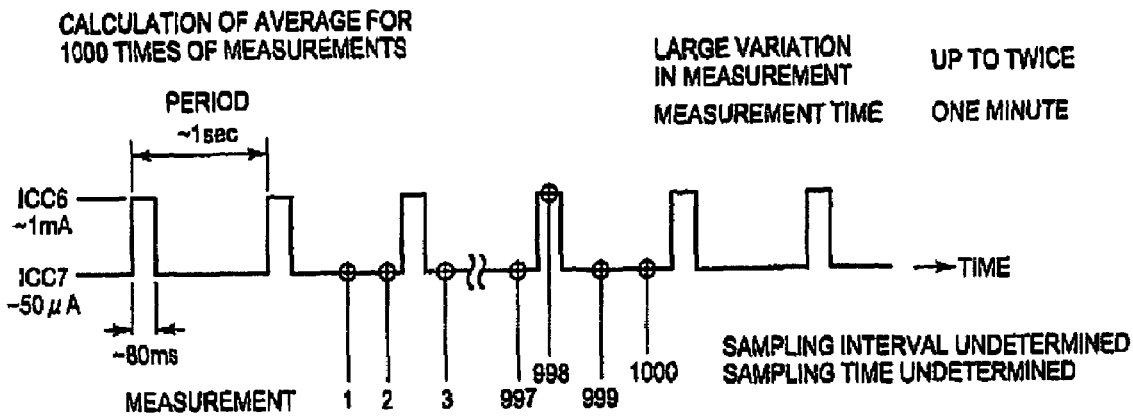
FIGS. 5A through 5C are views for describing a third related technique.
Figure 5B:
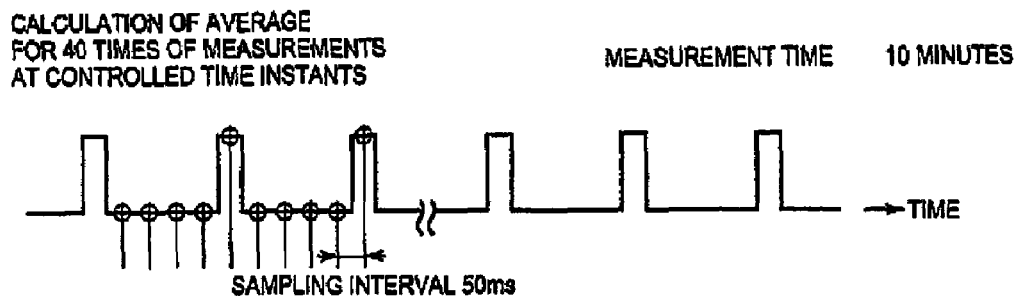
Figure 5C:
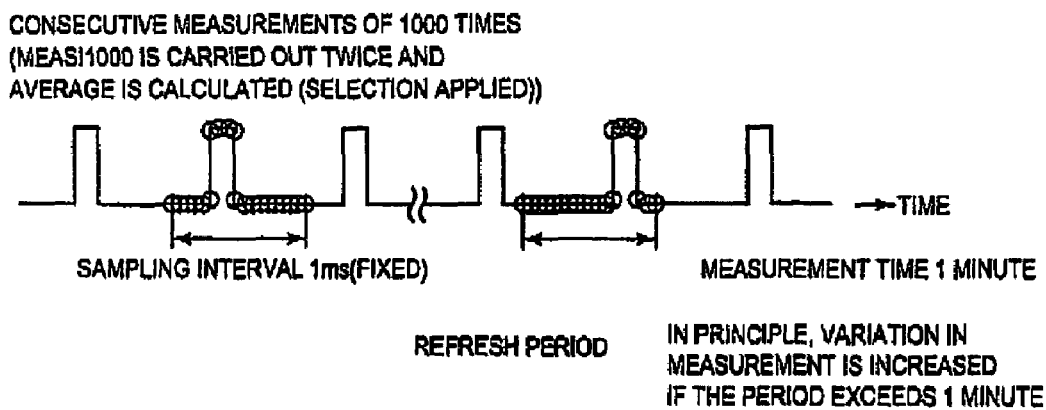

Herein, the internal refresh period measuring circuit 20 in FIGS. 5 and 6 determines the reference clocks as internal clocks with reference to the external clocks. Therefore, by increasing a frequency of the external clocks, it is possible to apply a load upon the inside of the semiconductor integrated circuit device (LSI) and to accelerate a burn-in (B/I) test. The burn-in test is to test a chip by giving a severe condition or load (high temperature, high voltage, and so on) to find a defective bit. Thus, in this invention, the frequency of the internal clocks can be increased from the "outside". Therefore, it is possible to accelerate a defect test by giving a load upon testing the chip.

According to this invention, the internal refresh period measuring circuit 20 is mounted inside the SDRAM 30 so that the refresh period can directly be measured. In principle, the internal refresh period measuring circuit 20 attains high accuracy by adjusting the period of the reference clocks. The internal refresh period measuring circuit 20 mainly comprises a counter circuit and a register circuit. Therefore, a circuit scale is small and mounting is easy. Further, a period over a wide range can be measured. The time required for measurement is minimized in principle (down to about 10 seconds).

This invention is also applicable to temperature sensor trimming of the refresh period. Specifically, since the internal reference clocks are determined by the external clocks, it is possible to measure the internal refresh period, compensating the change in operating temperature or voltage required for the device.

Figure 10:
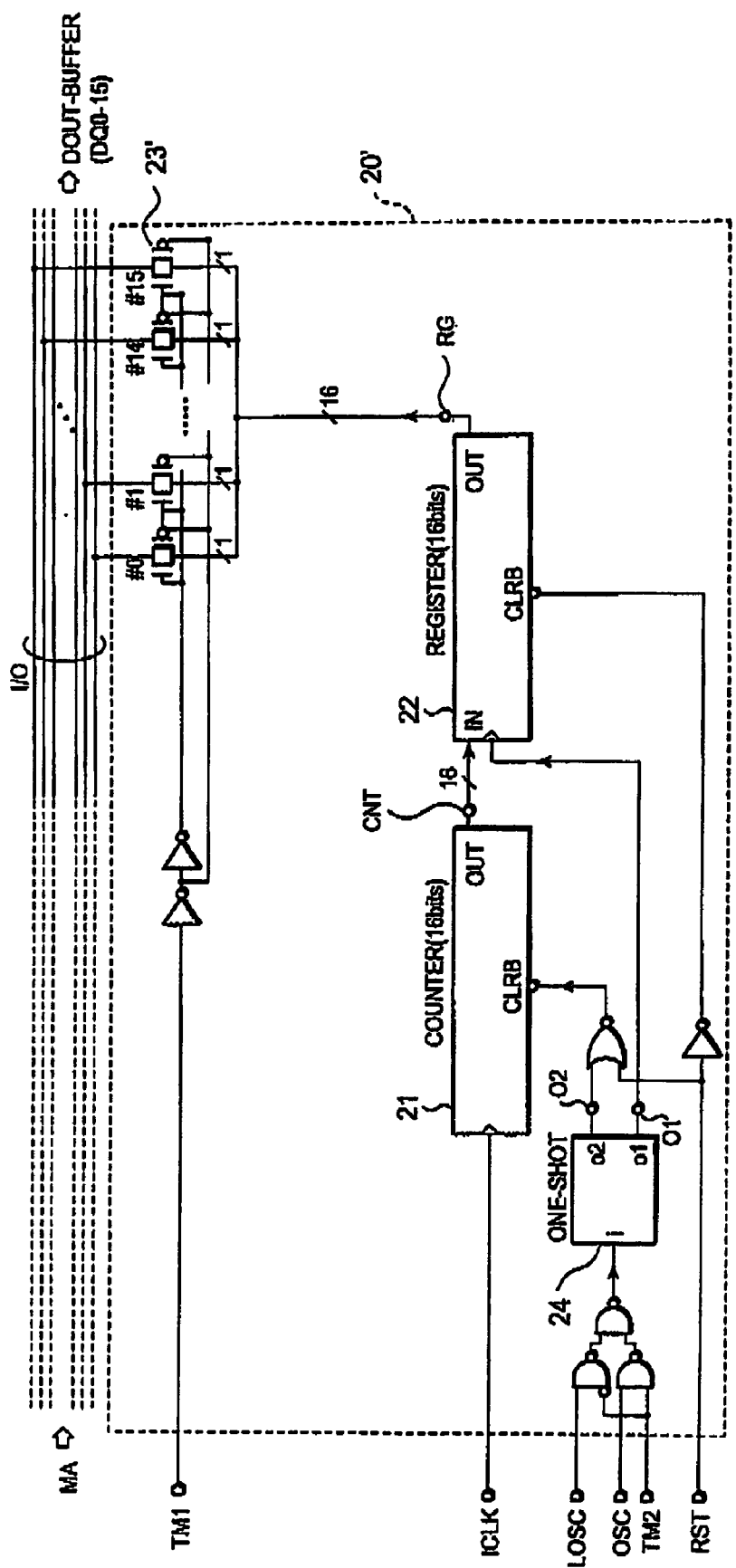
FIG. 10 is a block diagram of an internal refresh period measuring circuit according to a second embodiment of this invention.

Referring to FIG. 10, an internal refresh period measuring circuit 20' according to a second embodiment of this invention is similar in structure to the internal refresh period measuring circuit 20 in FIG. 6 except that the FETs 23 are replaced by a predetermined number of switches 23'. The switches 23' serve as output circuits to be turned on during a period in which the test mode signal TM1 has a high level (i.e., during a test mode period).

Referring to FIGS. 6, 7, and 10, the semiconductor integrated circuit device according to one aspect of this invention will be summarized herein. Specifically, in the semiconductor integrated circuit device having the DRAM 30, the DRAM 30 comprises the memory array (BANK #0 to #3) and the control portion 31 supplied with the external clocks CLK from the outside of the DRAM 30. The control portion 31 comprises the command decode portion 32 responsive to the external command from the outside of the DRAM 30 for decoding the external command, and the self-refresh control circuit 33 for repeatedly carrying out the self-refresh operation upon the memory array in the self-refresh period when the self-refresh control circuit 33 is activated.

The DRAM 30 further comprises the internal refresh period measuring circuit 20 or 20' for measuring the self-refresh period.

When the test mode command for measuring the self-refresh period is received as the external command, the command decode portion 32 delivers the test mode signal TM1 representative of the test mode to the internal refresh period measuring circuit 20 or 20', supplies the external clocks CLK as the reference clocks ICLK to the internal refresh period measuring circuit 20 or 20', and then activates the self-refresh control circuit 33.

When activated, the self-refresh control circuit 33 carries out the self-refresh operation upon the memory array and delivers the internal oscillation signal OSC or LOSC having the self-refresh period to the internal refresh period measuring circuit 20 or 20'.

The internal refresh period measuring circuit 20 or 20' comprises the counter 21 for counting the number of the reference clocks supplied during the self-refresh period of the internal oscillation signal supplied thereto, and the output circuit 23 or 23' for delivering the count result of the count-up operation by the counter 21 to the outside of the internal refresh period measuring circuit 20 or 20' in response to the test mode signal.

The output circuit may output the count result of the count-up operation of the counter 21 to the input/output bus I/O in the DRAM 30 in response to the test mode signal.

By multiplying the count result outputted by the output circuit 23 or 23' to the outside of the internal refresh period measuring circuit 20 or 20' and the period of the external clocks, the self-refresh period of the semiconductor integrated circuit device can be obtained.

Typically, the self-refresh period is one of a normal self-refresh period and a super self-refresh period longer than the normal self-refresh period.

The internal refresh period measuring circuit 20 or 20' may further comprise the one-shot multivibrator 24 and the register 22 connected to an output terminal of the counter 21. The one-shot multivibrator 24 is supplied with the internal oscillation signal and, in response to the rising edge of the internal oscillation signal, produces the first pulse signal O1 for supplying the value in the counter 21 to the register 22.

Further, in response to a falling edge of the first pulse signal O1, the one-shot multivibrator 24 produces the second pulse signal O2 for resetting the counter 21. The counter 21 is for counting the number of the reference clocks after the counter 21 is reset by the second pulse signal O2 and before the counter 21 is reset by the next second pulse signal O2. The register 22 is for memorizing the value in the counter 21 as the count result in response to the first pulse signal O1. The output circuit 23 or 23' outputs the count result memorized in the register to the outside of the internal refresh period measuring circuit 20 or 20' in response to the test mode signal.

Supplied with the test mode command as the external command, the input buffer circuit or command decode portion 32 delivers the test mode signal to the internal refresh period measuring circuit 20 or 20' and supplies the external clocks as the reference clocks to the internal refresh period measuring circuit 20 or 20'. Subsequently, supplied with the self-refresh mode entry command as the external command, the input buffer circuit or command decode portion 32 activates the self-refresh control circuit 33.

An existing memory tester can not directly measure a long-period operating current. Therefore, in the foregoing embodiments, the semiconductor integrated circuit device (LSI) is internally provided with the test mode capable of measuring the internal period so as to enable indirect measurement. Hereinafter, description will be made of a measuring instrument for directly measuring the long-period operating current.

Figure 11:
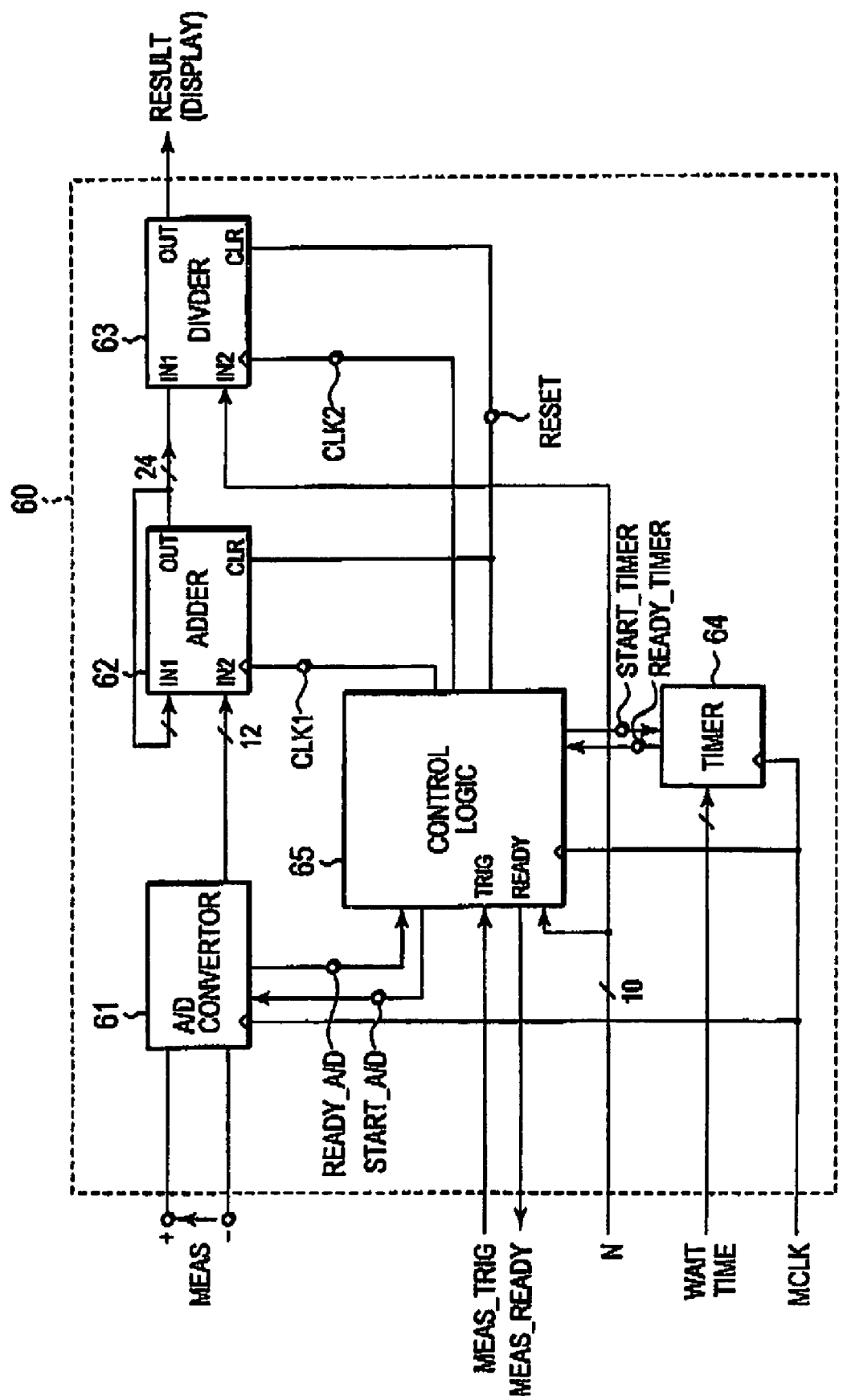
FIG. 11 is a block diagram of a digital measuring instrument according to a third embodiment of this invention.

Referring to FIG. 11, a digital measuring instrument 60 according to a third embodiment of this invention comprises an A/D (analog-to-digital) converter 61, an adder 62, a divider 63, a timer 64, and a controller 65.

The A/D converter 61 converts measured analog data MEAS of the operating current into digital data to obtain the digital data as measured data (acquired data). In case of measurement of an electric current, a current value is converted into a voltage value. Therefore, the electric current at that time instant can not be obtained but an average current for a period of about 100 μsec is obtained. The time required for a measuring operation is about 100 μsec. Upon reception of a start pulse signal START_A/D, acquisition of the measured data (sampling of measured analog data MEAS) is started. Upon completion of acquisition (sampling of measured analog data MEAS), a ready pulse signal READY_A/D is produced.

The adder 62 integrates a plurality of measured data (output data of the A/D converter 61) to obtain an integrated value. The divider 63 divides the integrated value by the number N of times of measurements (N being an integer not smaller than 3) to obtain an average. Each of the adder 62 and the divider 63 is responsive to clocking and executes a calculation to produce an output. By a clear signal (reset pulse signal) RESET, register data internally held are cleared (reset) into zero.

The timer 64 adjusts a period of acquiring the measured data by adjusting a time interval after completion of acquisition and before start of next acquisition. Existing instruments have no such function. In response to the start pulse signal START_TIMER, time monitoring is started. After lapse of a given wait time (WAIT-TIME), the ready pulse signal READY_TIMER is delivered to the controller 65 to thereby notify completion of time monitoring.

The controller 65 controls the A/D converter 61, the adder 62, the divider 63, and the timer 64 to complete the measuring operation. In response to a trigger pulse signal MEAS_TRIG, the measuring operation is started. Upon completion of the measuring operation, a ready pulse signal MEAS_READY is produced. The controller 65 is a single-phase sequential circuit operable in synchronization with a reference clock signal MCLK.

Figure 12:
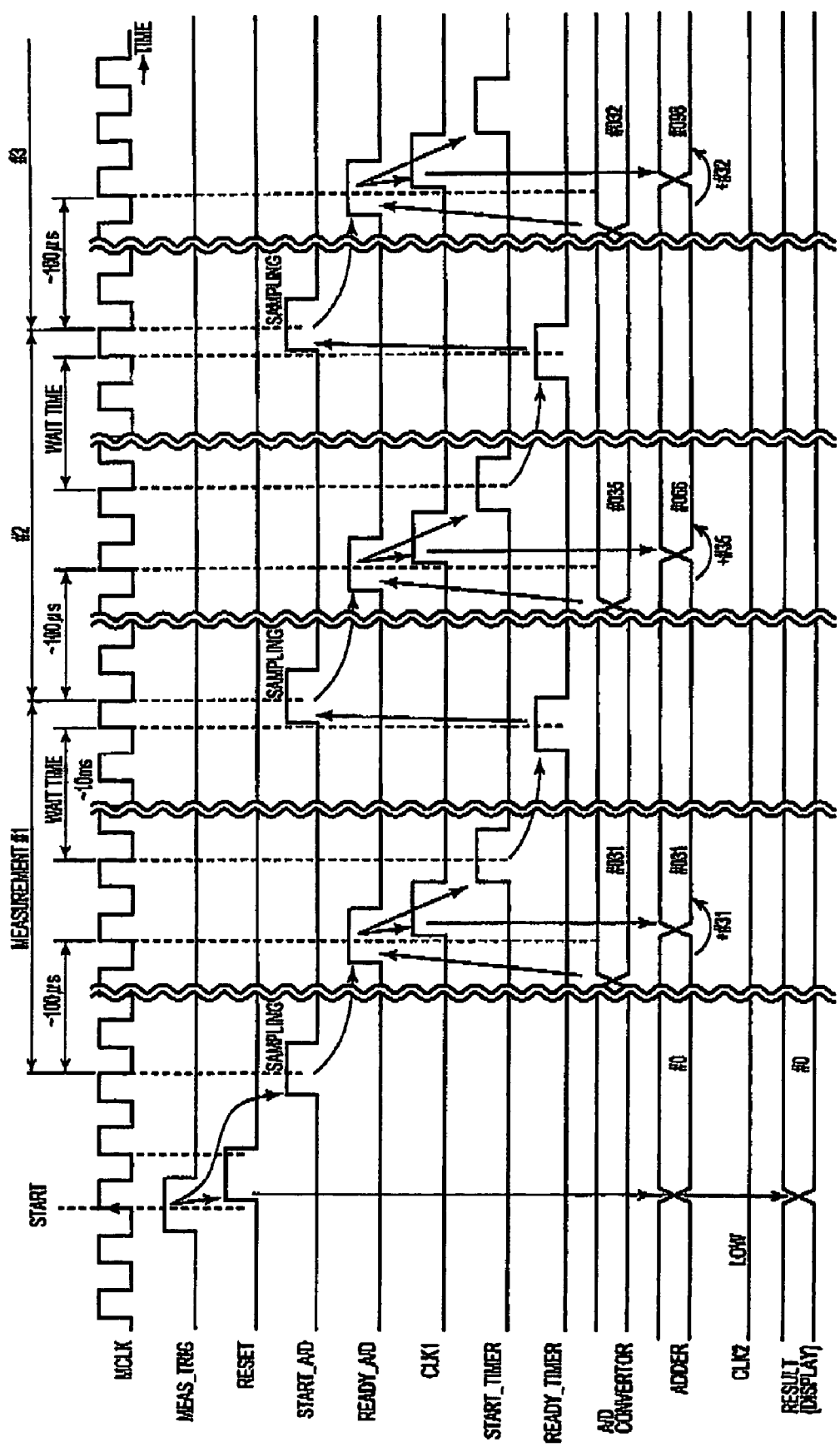
FIG. 12 is a view showing a first part of a measuring operation of the digital measuring instrument in FIG. 11 (from the start of the measuring operation to consecutive measurements)
Figure 13:
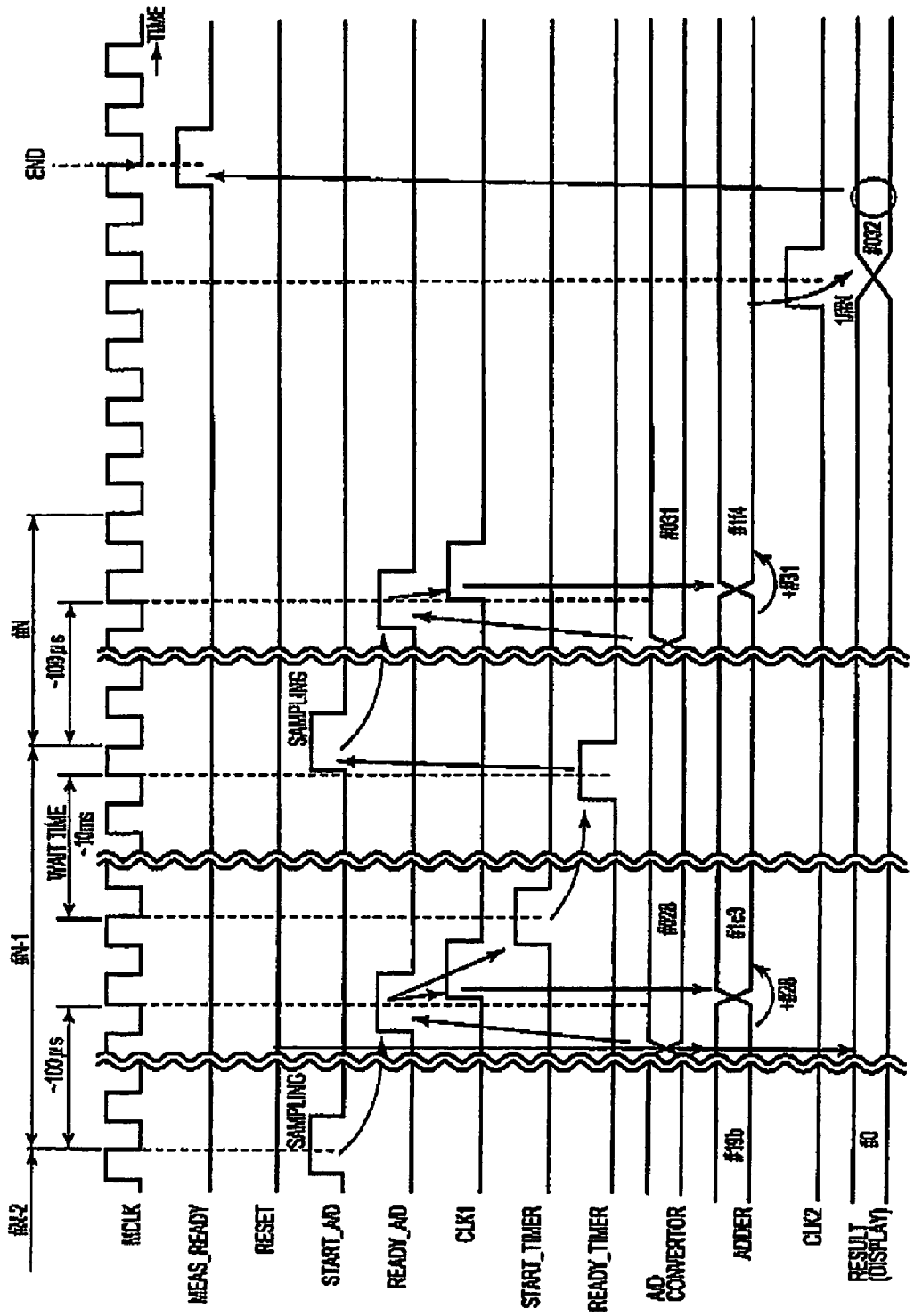
FIG. 13 is a view showing a second part of the measuring operation of the digital measuring instrument in FIG. 11 (from the consecutive measurements to the end of the measuring operation).

Referring to FIGS. 12 and 13, the measuring operation of the digital measuring instrument 60 in FIG. 11 will be described. In the illustrated example, the time interval after completion of acquisition of the measured data and before start of next acquisition is about 10 ms. Measurement is repeatedly carried out 10 times (N=10). Finally, an average is produced.

A CPU (tester processor) of a memory tester (not shown) produces a measuring instruction. The trigger pulse signal MEAS_TRIG is pulse-driven. Supplied with the trigger pulse signal MEAS_TRIG, the controller 65 produces the reset pulse signal RESET. Consequently, the data held by the adder 62 and the divider 63 are cleared (initialized) and the measuring operation is ready.

Next, the controller 65 pulse-drives the start pulse signal START_A/D for the A/D converter 61 to acquire the measured data. After lapse of about 100 µsec, the A/D converter 61 outputs the measured data and returns the ready pulse signal READY_A/D.

Supplied with the ready pulse signal READY_A/D, the controller 65 executes a clocking operation (pulse-driving of CLK1) for the adder 62 to make the adder 62 carry out an addition. In a first addition, 0 is added to first measured data so that the first measured data itself is obtained as a result of addition. In second and subsequent additions, the measured data are integrated.

Following the addition at the adder 62, the controller 65 pulse-drives the start pulse signal START_TIMER for the timer 64 to activate the timer 64. For a predetermined wait time (WAIT-TIME) of about 10 ms, measurement is temporary suspended. After lapse of the waft time (WAIT-TIME), the timer 64 returns the ready pulse signal READY_TIMER to the controller 65. Supplied with the ready pulse signal READY_TIMER, the controller 65 proceeds to a second measuring operation. By the wait time of about 10 ms, the period of acquiring the measured data can be controlled.

In digital measurement presently carried out, the time interval after completion of acquisition of the measured data and before start of next acquisition is preferably as short as possible. In view of the above, the time interval is actually fixed to a predetermined value within a range between about 100 µsec and about 1 ms.

Like the first measurement, the second measurement is carried out. The controller 65 pulse-drives the start pulse signal START_A/D for the A/D converter 61 to acquire the measured data. Thereafter, the controller 65 controls the second measurement in the manner similar to the first measurement.

Subsequently, the controller 65 repeats the similar operation up to the N-th measurement. Upon completion of the N-th measurement, the controller 65 executes a clocking operation (pulse-driving of CLK2) for the divider 63 to make the divider 63 execute the division so that an average of measured values is produced. In the example being illustrated in FIGS. 12 and 13, #1f4 (hexadecimal number) as an integrated value for 10 times of measurements is divided by the number (N=10) of times of measurement to obtain #32 (hexadecimal number) as the average.

Upon completion of a series of measurements, the controller 65 returns the ready pulse signal MEAS_READY to the CPU (tester processor) of the memory tester to notify the completion of measurement. Simultaneously, the last measured data RESULT are transferred to the output device.

Thus, in the above-mentioned digital measuring instrument 60, the time interval after completion of acquisition of the measured data and before start of next acquisition and the number of times of measurements can be selected. In the prior art, the time interval after completion of acquisition of the measured data and before start of next acquisition is fixed to about 1 ms. Therefore, even if the number of times of measurements is 1000 times as a maximum number of times, an average current only for one second (1 ms×1000 times) can be monitored. Thus, the number of times of measurements is uselessly large. On the other hand, in the above-mentioned digital measuring instrument 60 in this invention, 1000 times of measurements can be executed in a time interval of 10 ms after completion of acquisition of the measured data and before start of next acquisition and the average current for 10 seconds can be monitored.

While this invention has thus far been described in conjunction with the preferred embodiments thereof, it will be readily possible for those skilled in the art to put this invention into practice in various other manners without departing from the scope of this invention.

What is claimed is:

1. A semiconductor integrated circuit device having a DRAM, the DRAM comprising a memory array and a control portion supplied with external clocks from the outside of the DRAM, the control portion comprising a command decode portion responsive to an external command from the outside of the DRAM for decoding the external command, and a self-refresh control circuit for repeatedly carrying out a self-refresh operation upon the memory array in a self-refresh period when the self-refresh control circuit is activated, wherein:

the DRAM further comprises an internal refresh period measuring circuit for measuring the self-refresh period;

the command decode portion delivering a test mode signal representative of a test mode to the internal refresh period measuring circuit, supplying the external clocks as reference clocks to the internal refresh period measuring circuit, and then activating the self-refresh control circuit when a test mode command for measuring the self-refresh period is received as the external command;

the self-refresh control circuit carrying out the self-refresh operation upon the memory array and delivering an internal oscillation signal having the self-refresh period to the internal refresh period measuring circuit when the self-refresh control circuit is activated;

the internal refresh period measuring circuit comprising a counter for counting the number of the reference clocks supplied during the self-refresh period of the internal oscillation signal supplied thereto, and an output circuit for delivering a count result of a count-up operation by the counter to the outside of the internal refresh period measuring circuit in response to the test mode signal.

2. The semiconductor integrated circuit device as claimed in claim 1, wherein:

the output circuit outputs the count result of the count-up operation of the counter to an input/output bus in the DRAM in response to the test mode signal.

3. The semiconductor integrated circuit device as claimed in claim 1, wherein:

the self-refresh period of the semiconductor integrated circuit device is obtained by multiplying the count result outputted by the output circuit to the outside of the internal refresh period measuring circuit and the period of the external clocks.

4. The semiconductor integrated circuit device as claimed in claim 1, wherein:
the self-refresh period is one of a normal self-refresh period and a super self-refresh period longer than the normal self-refresh period.

5. The semiconductor integrated circuit device as claimed in claim 1, wherein:
the internal refresh period measuring circuit further comprise a one-shot multivibrator and a register connected to an output terminal of the counter;
the one-shot multivibrator being supplied with the internal oscillation signal and, in response to a rising edge of the internal oscillation signal, producing a first pulse signal for supplying a value in the counter to the register, the one-shot multivibrator producing. In response to a falling edge of the first pulse signal, a second pulse signal for resetting the counter;
the counter being is for counting the number of the reference clocks after the counter is reset by the second pulse signal and before the counter is reset by a next second pulse signal;
the register being for memorizing the value in the counter as the count result in response to the first pulse signal;
the output circuit outputting the count result memorized in the register to the outside of the internal refresh period measuring circuit in response to the test mode signal.

6. The semiconductor integrated circuit device as claimed in claim 1, wherein:
the command decode portion is supplied with the test mode command as the external command and then delivers the test mode signal to the internal refresh period measuring circuit and supplies the external clocks as the reference clocks to the internal refresh period measuring circuit, the command decode portion being subsequently supplied with a self-refresh mode entry command as the external command and then activating the self-refresh control circuit.

7. A digital measuring instrument for measuring an operating current when a semiconductor integrated circuit device having a DRAM carries out a self-refresh operation in a self-refresh period, the digital measuring instrument comprising:
an A/D converter for carrying out an A/D converting operation of converting measured analog data of the operating current into digital data to output the digital data as acquired data;
an adder for carrying out an addition of adding the acquired data to adder output data to output the result of addition as the adder output data;
a timer given a wait time; and
a controller;
the controller being response to a measuring operation start signal and starting a first measuring operation, making the A/D converter carry out the A/D converting operation to output the acquired data, then making the adder carry out the addition to output the result of addition as the adder output data, then starting the timer to monitor the wait time as a measurement temporary suspension state, finishing the first measuring operation when the timer completes monitoring of the wait time, starting a second measuring operation, and carrying out the second measuring operation in the manner similar to the first measuring operation.

8. The digital measuring instrument as claimed in claim 7, wherein:
the addition by the adder in the first measuring operation is an operation of adding the acquired data to 0 as the adder output data.

9. A digital measuring instrument for measuring an operating current when a semiconductor integrated circuit device having a DRAM carries out a self-refresh operation in a self-refresh period, the digital measuring instrument comprising:
an A/D converter for carrying out an A/D converting operation of converting measured analog data of the operating current into digital data to output the digital data as acquired data;
an adder for carrying out an addition of adding the acquired data to adder output data to output the result of addition as the adder output data;
a divider supplied with the number N of times of measurements (N being an integer not smaller than 3) for carrying out a division of dividing the adder output data by the number N to obtain an average;
a timer given a wait time; and
a controller supplied with the number N;
the controller being response to a measuring operation start signal and starting a first measuring operation, making the A/D converter carry out the A/D converting operation to output the acquired data, then making the adder carry out the addition to output the result of addition as the adder output data, then starting the timer to monitor the wait time as a measurement temporary suspension state, finishing the first measuring operation when the timer completes monitoring of the wait time, starting a second measuring operation, carrying out the second measuring operation in the manner similar to the first measuring operation, repeatedly carrying out third through N-th measuring operations in the manner similar to the first measuring operation, and making the divider carry out the division to produce the average when the N-th measuring operation is finished.

10. The digital measuring instrument as claimed in claim 9, wherein:
the addition by the adder in the first measuring operation is an operation of adding the acquired data to 0 as the adder output data.

* * * * *